United States Patent
Ballantyne et al.

(10) Patent No.: US 7,872,543 B2
(45) Date of Patent: Jan. 18, 2011

(54) BI-POLAR MODULATOR

(75) Inventors: Gary John Ballantyne, Christchurch (NZ); Arun Jayaraman, San Ramon, CA (US); Bo Sun, Carlsbad, CA (US); Gurkanwal Singh Sahota, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 69 days.

(21) Appl. No.: 12/133,726

(22) Filed: Jun. 5, 2008

(65) Prior Publication Data

US 2009/0302963 A1    Dec. 10, 2009

(51) Int. Cl.
 *H04L 27/20* (2006.01)
(52) U.S. Cl. .................................. 332/103; 332/105
(58) Field of Classification Search ......... 332/103–105, 332/149
See application file for complete search history.

(56) References Cited

U.S. PATENT DOCUMENTS 6,181,199 B1 * 1/2001 Camp et al. .................. 330/10
6,983,024 B2 * 1/2006 Ballantyne .................. 375/261

FOREIGN PATENT DOCUMENTS

WO    0041371    7/2000

OTHER PUBLICATIONS

International Search Report—PCT/US09/045991—International Search Authority EPO—Nov. 5, 2009.

* cited by examiner

*Primary Examiner*—David Mis
(74) *Attorney, Agent, or Firm*—Larry J. Moskowitz; William M. Hooks

(57) ABSTRACT

A bi-polar modulator that can perform quadrature modulation using amplitude modulators is described. In one design, the bi-polar modulator includes first and second amplitude modulators and a summer. The first amplitude modulator amplitude modulates a first carrier signal with a first input signal and provides a first amplitude modulated signal. The second amplitude modulator amplitude modulates a second carrier signal with a second input signal and provides a second amplitude modulated signal. The summer sums the first and second amplitude modulated signals and provides a quadrature modulated signal that is both amplitude and phase modulated. The first and second input signals may be obtained based on absolute values of first and second modulating signals, respectively. The first and second carrier signals have phases determined based on the sign of the first and second modulating signals, respectively. Each amplitude modulator may be implemented with a class-E amplifier.

28 Claims, 4 Drawing Sheets

BI-POLAR MODULATOR

BACKGROUND

I. Field

The present invention relates generally to electronics, and more specifically to a modulator for use in a communication system.

II. Background

In a communication system, a transmitter may first process data digitally to obtain coded data. The transmitter may generate an inphase (I) modulating signal and a quadrature (Q) modulating signal based on the coded data. The transmitter may then modulate a carrier signal with the I and Q modulating signals to obtain a quadrature modulated signal that may be more suitable for transmission via a communication channel. The carrier signal is typically a periodic signal (e.g., a sinusoidal signal) of a particular frequency. The quadrature modulation varies both the amplitude and phase of the carrier signal with the modulating signals. Information would then reside in the changes in the amplitude and phase of the carrier signal. It is desirable to perform quadrature modulation using a modulator having good performance.

SUMMARY

A bi-polar modulator that can perform quadrature modulation using amplitude modulators is described herein. In one design, the bi-polar modulator includes first and second amplitude modulators and a summer. The first amplitude modulator receives and amplitude modulates a first carrier signal (e.g., an I carrier signal) with a first input signal and provides a first amplitude modulated signal. The second amplitude modulator receives and amplitude modulates a second carrier signal (e.g., a Q carrier signal) with a second input signal and provides a second amplitude modulated signal. The summer sums the first and second amplitude modulated signals and provides a quadrature modulated signal that is both amplitude and phase modulated.

The first and second input signals may be generated based on first and second (e.g., I and Q) modulating signals. In one design, the absolute value of the first modulating signal is provided as the first input signal, and the absolute value of the second modulating signal is provided as the second input signal.

In one design, the first carrier signal has a phase that is determined based on the sign of the first modulating signal, and the second carrier signal has a phase that is determined based on the sign of the second modulating signal. In one design, the bi-polar modulator further includes first and second switches. The first switch receives first and second local oscillator (LO) signals and provides either the first or second LO signal as the first carrier signal based on the sign of the first modulating signal. The second switch receives third and fourth LO signals and provides either the third or fourth LO signal as the second carrier signal based on the sign of the second modulating signal. The first and second LO signals may be 180 degrees out of phase, the third and fourth LO signals may be 180 degrees out of phase, and the first and third LO signals may be 90 degrees out of phase.

In one design, the first amplitude modulator comprises a first class-E amplifier that is switched on and off by the first carrier signal and has an output amplitude determined by the first input signal. The second amplitude modulator comprises a second class-E amplifier that is switched on and off by the second carrier signal and has an output amplitude determined by the second input signal.

Various aspects and features of the disclosure are described in further detail below.

DETAILED DESCRIPTION

The bi-polar modulator described herein may be used for wireless communication, wireline communication, and other applications. The bi-polar modulator may also be used for various electronics devices such as wireless communication devices, cellular phones, personal digital assistants (PDAs), handheld devices, wireless modems, laptop computers, cordless phones, Bluetooth devices, base stations, etc. For clarity, the use of the bi-polar modulator in a wireless communication device, which may be a cellular phone or some other device, is described below.

Figure 1:
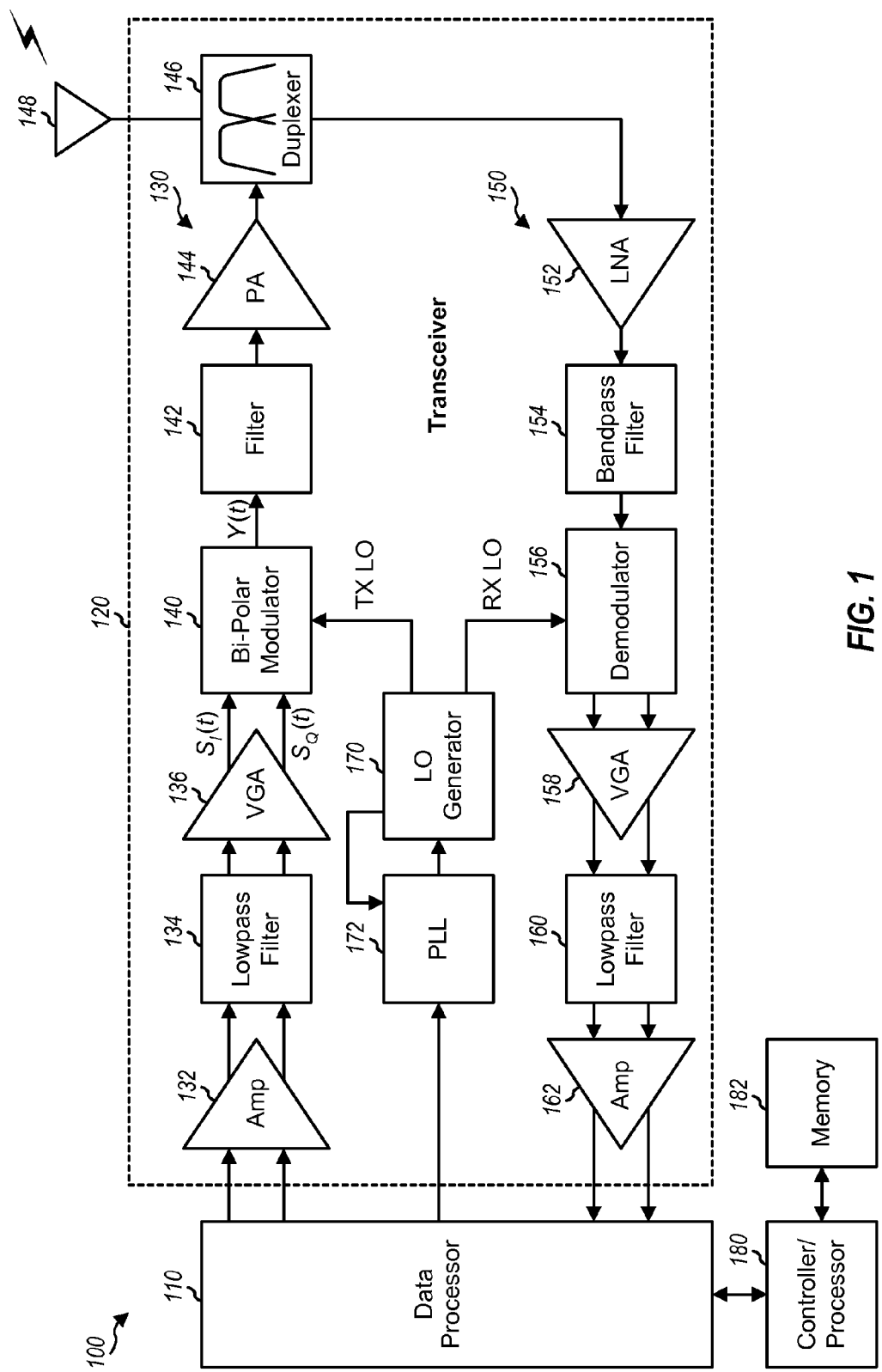
FIG. 1 shows a block diagram of a wireless communication device.

FIG. 1 shows a block diagram of a design of a wireless communication device 100. In this design, wireless device 100 includes a data processor 110, a transceiver 120, a controller/processor 180, and a memory 182. Transceiver 120 includes a transmitter 130 and a receiver 150 that support bi-directional wireless communication. In general, wireless device 100 may include any number of transmitters and any number of receivers for any number of communication systems and frequency bands.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. Within transmitter 130, the I and Q analog output signals are amplified by an amplifier (Amp) 132, filtered by a lowpass filter 134 to remove images caused by digital-to-analog conversion, and amplified by a variable gain amplifier (VGA) 136 to obtain I and Q modulating signals, which are denoted as $S_I(t)$ and $S_Q(t)$.

A bi-polar modulator 140 receives the I and Q modulating signals from VGA 136 and a transmit LO (TX LO) signal from an LO generator 170. The terms "LO signal", "carrier signal", and "carrier" are synonymous and are often used interchangeably. Bi-polar modulator 140 modulates the TX LO signal with the I and Q modulating signals and generates a quadrature modulated signal, which is denoted as $Y(t)$. A quadrature modulated signal is a signal having both its amplitude and its phase modulated or varied. Bi-polar modulator 140 may also generate a phase-only modulated signal, but this is not discussed below. The quadrature modulated signal is filtered by a filter 142 to remove images caused by the frequency upconversion and amplified by a power amplifier (PA) 144 to generate an RF output signal. The RF output signal is routed through a duplexer 146 and transmitted via an antenna 148.

In the receive path, antenna 148 receives signals transmitted by base stations and provides an RF received signal, which is routed through duplexer 146 and provided to receiver 150. Within receiver 150, the RF received signal is amplified by a low noise amplifier (LNA) 152 and filtered by a bandpass filter 154 to obtain an RF input signal. A demodulator 156 receives the RF input signal from filter 154 and a receive LO (RX LO) signal from LO generator 170. Demodulator 156 demodulates the RF input signal with the RX LO signal and provides I and Q baseband signals. The I and Q baseband signals are amplified by a VGA 158, filtered by a lowpass filter 160, and amplified by an amplifier 162 to obtain I and Q analog input signals, which are provided to data processor 110.

LO generator 170 generates the TX LO signal used for frequency upconversion and the RX LO signal used for frequency downconversion. Each LO signal is a periodic signal with a particular fundamental frequency and may be of any waveform type, e.g., sinusoidal, square wave, sawtooth, etc. The TX LO signal and the RX LO signal may have different frequencies. LO generator 170 may include one or more voltage controlled oscillators (VCOs), reference oscillators, dividers, buffers, etc. A phase locked loop (PLL) 172 receives timing information from data processor 110 and feedback from LO generator 170. PLL 172 generates controls used to adjust the frequency and/or phase of the LO signals from LO generator 170.

FIG. 1 shows an example transceiver design. In general, the conditioning of the signals in transmitter 130 and receiver 150 may be performed by one or more stages of amplifier, filter, modulator, demodulator, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. For example, filter 142 may be omitted, and the output of bi-polar modulator 140 may be coupled directly to power amplifier 144. All or a portion of transceiver 120 may be implemented on one or more analog integrated circuits (ICs), RF ICs (RFICs), mixed-signal ICs, etc.

Data processor 110 may include various processing units for data transmission and reception and other functions. Controller/processor 180 may control the operation at wireless device 100. Memory 182 may store program codes and data for wireless device 100. Data processor 110, controller/processor 180, and/or memory 182 may be implemented on one or more application specific integrated circuits (ASICs).

Bi-polar modulator 140 may generate a quadrature modulated signal, which may be expressed as:

$$Y(t) = S_I(t) \cdot \cos(\omega_0 t) + S_Q(t) \cdot \sin(\omega_0 t), \quad \text{Eq (1)}$$

where $S_I(t)$ is the I modulating signal and $S_Q(t)$ is the Q modulating signal,
$\cos(\omega_0 t)$ is an I LO signal and $\sin(\omega_0 t)$ is a Q LO signal,
$Y(t)$ is the quadrature modulated signal, and
$\omega_0 = 2\pi f_0$ is the LO frequency in radians and $f_0$ is the LO frequency in Hertz.

The $\cos(\omega_0 t)$ and $\sin(\omega_0 t)$ signals may be generated from the TX LO signal.

As shown in equation (1), the quadrature modulated signal may be generated by (i) modulating the I LO signal with the I modulating signal to obtain an I modulated signal, (ii) modulating the Q LO signal with the Q modulating signal to obtain a Q modulated signal, and (iii) summing the I and Q modulated signals to obtain the quadrature modulated signal. A mixer may be used to modulate each LO signal with its modulating signal to obtain a corresponding modulated signal. However, mixers may have suboptimal performance.

In an aspect, amplitude modulators may be used for quadrature modulation. An amplitude modulator may have higher power and lower noise than a mixer, both of which may be desirable. An amplitude modulator can vary the amplitude of an LO signal based on a modulating signal and provide an amplitude modulated signal. An amplitude modulated signal is a signal having only its amplitude (but not its phase) modulated. Since the I and Q modulating signals have both positive and negative values, the I and Q LO signals cannot be amplitude modulated directly. This restriction may be circumvented by changing the phases of the LO signals when the sign of the I and Q modulating signals changes.

A quadrature modulated signal generated with amplitude modulators may be expressed as:

$$Y(t) = |S_I(t)| \cdot \cos\left(\omega_0 t + \text{sgn}[S_I(t)]\frac{\pi}{2} - \frac{\pi}{2}\right) + \\ |S_Q(t)| \cdot \sin\left(\omega_0 t + \text{sgn}[S_Q(t)]\frac{\pi}{2} - \frac{\pi}{2}\right), \quad \text{Eq (2)}$$

where $\text{sgn}[S_I(t)]$ is the sign of $S_I(t)$, which may be either +1 or −1,
$\text{sgn}[S_Q(t)]$ is the sign of $S_Q(t)$, which may also be either +1 or −1,
$|S_I(t)| \geq 0$ is an absolute I modulating signal, and
$|S_Q(t)| \geq 0$ is an absolute Q modulating signal.

In the design shown in equation (2), the $\cos(\omega_0 t)$ signal is amplitude modulated by the $|S_I(t)|$ signal when the sign of $S_I(t)$ is positive. The $\cos(\omega_0 t - \pi)$ signal is amplitude modulated by the $|S_I(t)|$ signal when the sign of $S_I(t)$ is negative. Since $\cos(\omega_0 t - \pi) = -\cos(\omega_0 t)$, the sign of $S_I(t)$ is preserved even when it is negative. Similarly, the $\sin(\omega_0 t)$ signal is amplitude modulated by the $|S_Q(t)|$ signal when the sign of $S_Q(t)$ is positive. The $\sin(\omega_0 t - \pi)$ signal is amplitude modulated by the $|S_Q(t)|$ signal when the sign of $S_Q(t)$ is negative. Since $\sin(\omega_0 t - \pi) = -\sin(\omega_0 t)$, the sign of $S_Q(t)$ is preserved even when it is negative.

In the design shown in equation (2), the phase of the I LO signal may be switched by 180° based on the sign of the $S_I(t)$ signal. Similarly, the phase of the Q LO signal may be switched by 180° based on the sign of the $S_Q(t)$ signal. Fast switching of the phases of the I and Q LO signals may be achieved with wideband PLLs or some other circuit.

In another design, $\cos(\omega_0 t)$ and $\cos(\omega_0 t + \pi)$ signals may be available, where $\cos(\omega_0 t + \pi) = \cos(\omega_0 t - \pi)$, and one of these signals may be selected based on the sign of $S_I(t)$. Similarly, $\sin(\omega_0 t)$ and $\sin(\omega_0 t + \pi)$ signals may be available, where $\sin(\omega_0 t + \pi) = \sin(\omega_0 t - \pi)$, and one of these signals may be selected based on the sign of $S_Q(t)$. The quadrature modulated signal may then be expressed as:

$$Y(t) = |S_I(t)| \cdot C_I(t) + |S_Q(t)| \cdot C_Q(t) = A_I(t) + A_Q(t), \quad \text{Eq (3a)}$$

where $$C_I(t) = \begin{cases} \cos(\omega_0 t) & \text{if sgn } [S_I(t)] = +1 \\ \cos(\omega_0 t + \pi) & \text{if sgn } [S_I(t)] = -1, \end{cases} \quad \text{Eq (3b)}$$

-continued $$C_Q(t) = \begin{cases} \sin(\omega_0 t) & \text{if sgn } [S_Q(t)] = +1 \\ \sin(\omega_0 t + \pi) & \text{if sgn } [S_Q(t)] = -1, \end{cases} \quad \text{Eq (3c)}$$

$A_I(t) = |S_I(t)| \cdot C_I(t)$ is an $I$ amplitude modulated signal, and $A_Q(t) = S_Q(t) \cdot C_Q(t)$ is a $Q$ amplitude modulated signal.

In equation set (3), $C_I(t)$ is an I carrier signal for an I amplitude modulator, and $C_Q(t)$ is a Q carrier signal for a Q amplitude modulator. Each carrier signal may be obtained by selecting one of two possible LO signals based on the sign of the corresponding modulating signal, as shown in equations (3b) and (3c).

Figure 2:
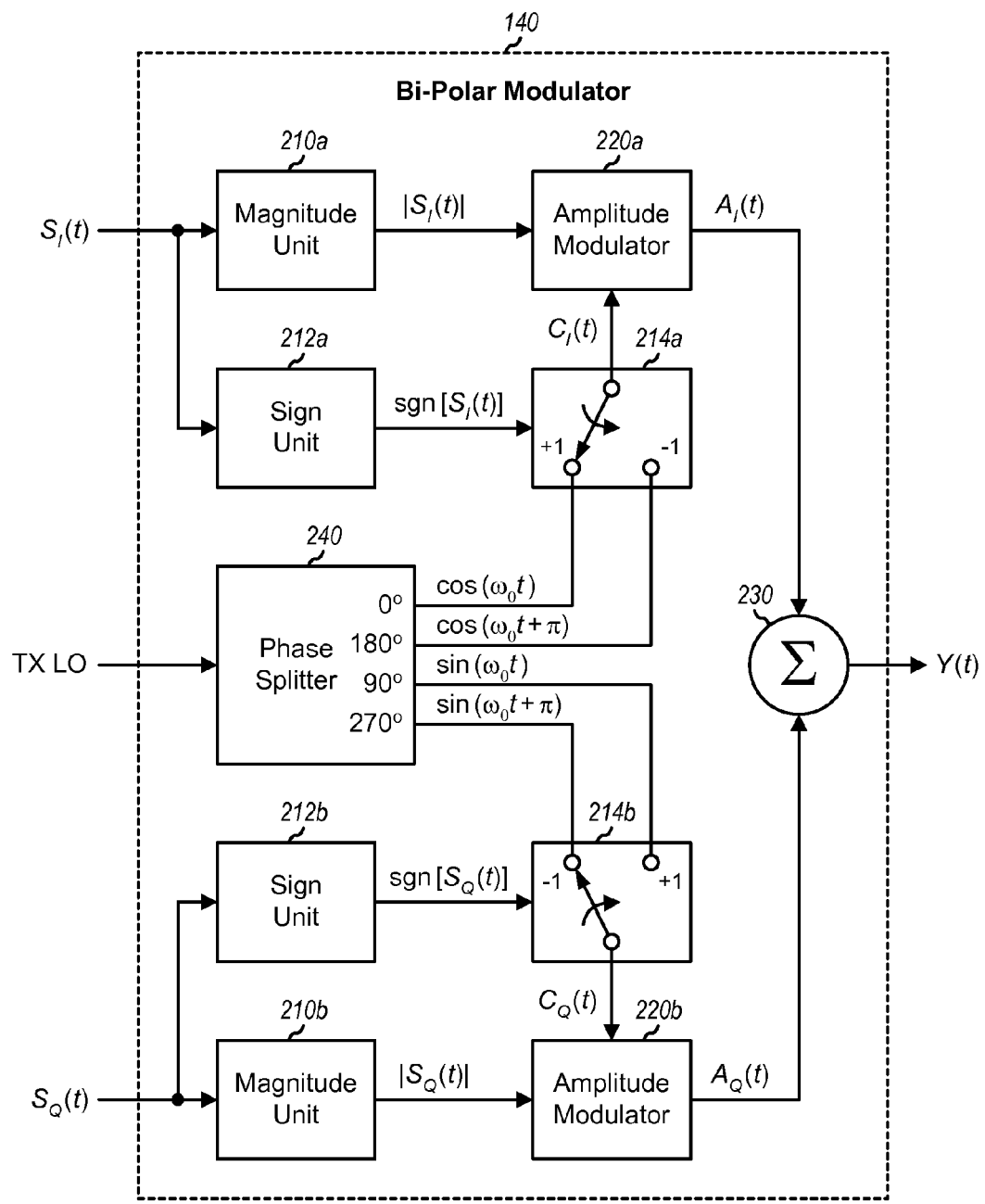
FIG. 2 shows a block diagram of a bi-polar modulator.

FIG. 2 shows a block diagram of a design of bi-polar modulator 140, which implements equation set (3). Bi-polar modulator 140 receives the $S_I(t)$ and $S_Q(t)$ modulating signals and the TX LO signal and provides the $Y(t)$ quadrature modulated signal.

In the I path, a magnitude unit 210a receives the $S_I(t)$ signal and provides the $|S_I(t)|$ signal to an amplitude modulator 220a. A sign unit 212a also receives the $S_I(t)$ signal and provides the sgn[$S_I(t)$] signal, which is equal to +1 when $S_I(t) \geq 0$ and equal to −1 when $S_I(t) < 0$. A switch 214a has its common node coupled to amplitude modulator 220a, its first throw receiving the $\cos(\omega_0 t)$ signal, its second throw receiving the $\cos(\omega_0 t + \pi)$ signal, and its control input receiving the sgn[$S_I(t)$] signal. Switch 214a provides the $\cos(\omega_0 t)$ signal as the $C_I(t)$ signal when sgn[$S_I(t)$]=+1 and provides the $\cos(\omega_0 t + \pi)$ signal as the $C_I(t)$ signal when sgn[$S_I(t)$]=−1. Amplitude modulator 220a modulates the $C_I(t)$ signal from switch 214a with the $|S_I(t)|$ signal from unit 210a and provides the $A_I(t)$ amplitude modulated signal.

In the Q path, a magnitude unit 210b receives the $S_Q(t)$ signal and provides the $|S_Q(t)|$ signal to an amplitude modulator 220b. A sign unit 212b also receives the $S_Q(t)$ signal and provides the sgn[$S_Q(t)$] signal, which is equal to +1 when $S_Q(t) \geq 0$ and equal to −1 when $S_Q(t) < 0$. A switch 214b has its common node coupled to amplitude modulator 220b, its first throw receiving the $\sin(\omega_0 t)$ signal, its second throw receiving the $\sin(\omega_0 t + \pi)$ signal, and its control input receiving the sgn[$S_Q(t)$] signal. Switch 214b provides the $\sin(\omega_0 t)$ signal as the $C_Q(t)$ signal when sgn[$S_Q(t)$]=+1 and provides the $\sin(\omega_0 t + \pi)$ signal as the $C_Q(t)$ signal when sgn[$S_Q(t)$]=−1. Amplitude modulator 220b modulates the $C_Q(t)$ signal from switch 214b with the $|S_Q(t)|$ signal from unit 210b and provides the $A_Q(t)$ amplitude modulated signal.

A summer 230 sums the $A_I(t)$ and $A_Q(t)$ signals from amplitude modulators 220a and 220b, respectively, and provides the $Y(t)$ quadrature modulated signal. If the outputs of amplitude modulators 220a and 220b are current signals, then summer 230 may be implemented with a summing node.

A phase splitter 240 receives the TX LO signal and generates the $\cos(\omega_0 t)$, $\sin(\omega_0 t)$, $\cos(\omega_0 t + \pi)$ and $\sin(\omega_0 t + \pi)$ signals, which have phases of 0°, 90°, 180° and 270°, respectively. The four LO signals from phase splitter 240 are thus 90° (or quadrature) shifted versions of each other. FIG. 2 shows phase splitter 240 being part of bi-polar modulator 140. Phase splitter 240 may also be part of LO generator 170 in FIG. 1.

FIG. 2 shows magnitude units 210a and 210b receiving the $S_I(t)$ and $S_Q(t)$ signals and providing the $|S_I(t)|$ and $|S_Q(t)|$ signals, respectively. FIG. 2 also shows sign units 212a and 212b receiving the $S_I(t)$ and $S_Q(t)$ signals and providing the sgn[$S_I(t)$] and sgn[$S_Q(t)$] signals, respectively. Units 210a, 210b, 212a and 212b may be implemented with analog circuits, as suggested in FIG. 2. Units 210a, 210b, 212a and 212b may also be implemented with digital circuits. For example, data processor 110 may perform the functions of units 210a and 210b and provide absolute I and Q analog output signals to transmitter 130. Data processor 110 may also perform the functions of units 212a and 212b and provide I and Q sign signals to bi-polar modulator 140.

Figure 3:
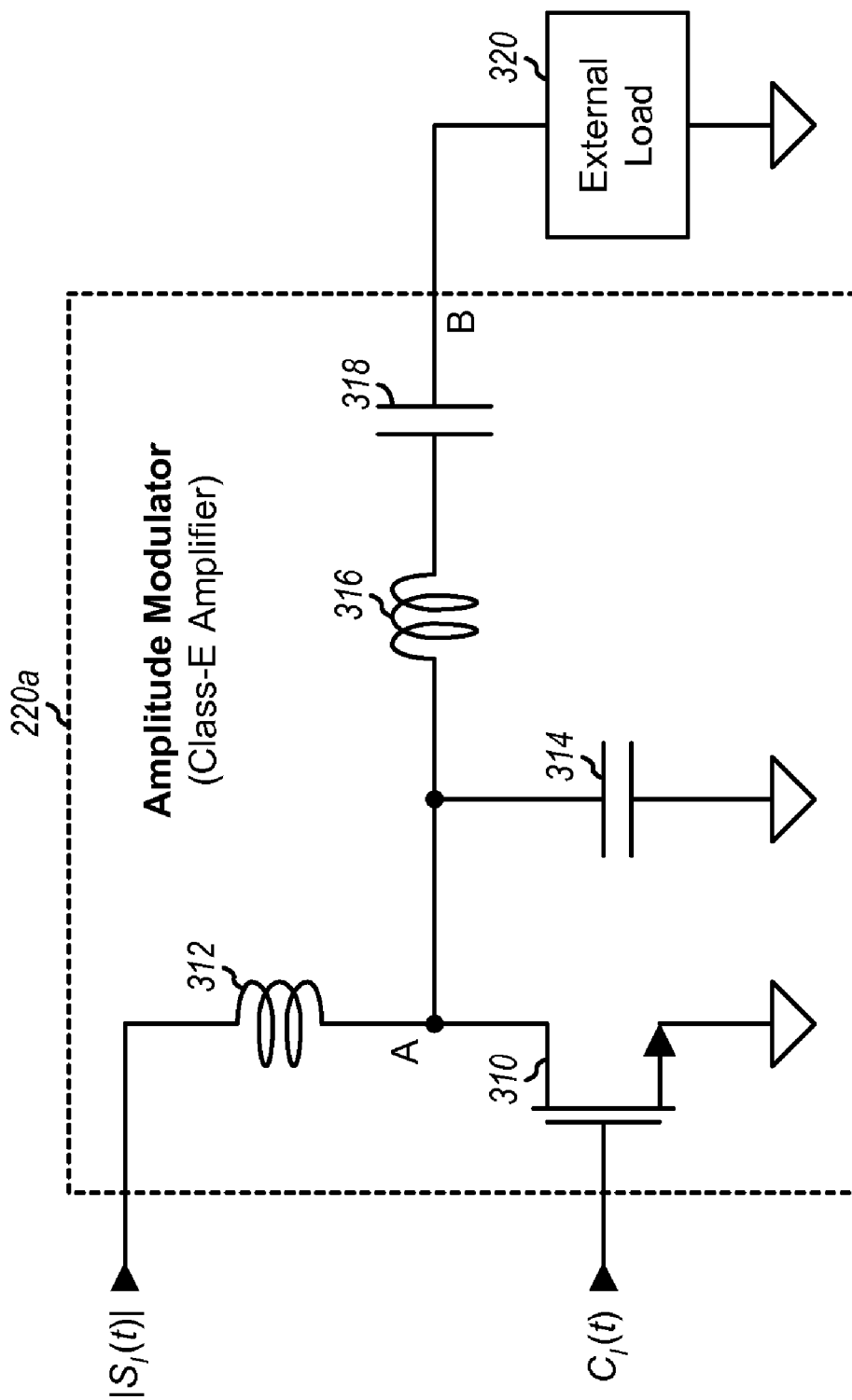
FIG. 3 shows a schematic diagram of an amplitude modulator implemented with a class-E amplifier.

FIG. 3 shows a schematic diagram of a design of amplitude modulator 220a in FIG. 2. In this design, amplitude modulator 220a is implemented with a class-E amplifier having higher efficiency than some other amplifiers such as class-B and class-C amplifiers. Within amplitude modulator 220a, an N-channel metal oxide semiconductor (NMOS) transistor 310 has its drain coupled to node A, its gate receiving the $C_I(t)$ signal, and its source coupled to circuit ground. An inductor 312 has one end coupled to node A and the other end receiving the $|S_I(t)|$ signal. A capacitor 314 is coupled between node A and circuit ground. An inductor 316 and a capacitor 318 are coupled in series, and the series combination is coupled between node A and node B. Node B is the output of amplitude modulator 220a. An external load 320 is coupled between node B and circuit ground. For simplicity, biasing circuit for NMOS transistor 310 is not shown in FIG. 3.

NMOS transistor 310 operates as a switch that is turned on and off by the $C_I(t)$ signal. Inductor 316 and capacitor 318 form a series LC circuit that resonates at the LO frequency of $f_0$ and passes current at frequency $f_0$ to external load 320. Inductor 312 and capacitor 314 form a parallel LC circuit that is coupled between node A and circuit ground. The values of inductor 312 and capacitor 314 may be selected to achieve the desired switching characteristics for the class-E amplifier. The operation of the class-E amplifier is described in further detail by H. Krauss, et al., in "Solid State Radio Engineering," Wiley, 1980, which is publicly available.

Amplitude modulator 220b may also be implemented with a class-E amplifier as shown in FIG. 3. Amplitude modulators 220a and 220b may also be implemented with other designs.

Figure 4:
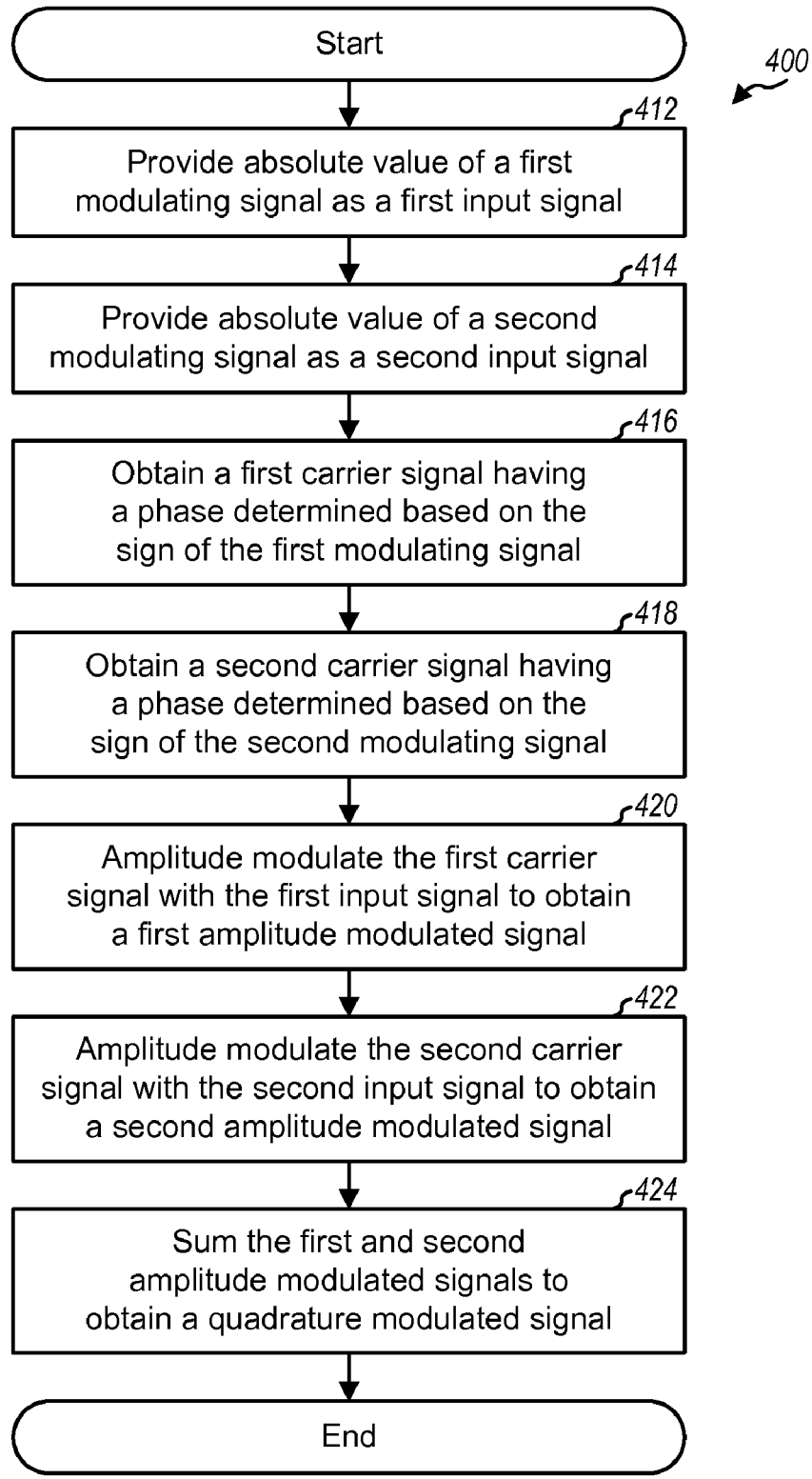
FIG. 4 shows a process for performing bi-polar modulation.

FIG. 4 shows a design of a process 400 for performing bi-polar modulation. Absolute value of a first modulating signal (e.g., an I modulating signal) may be provided as a first input signal (block 412). Absolute value of a second modulating signal (e.g., a Q modulating signal) may be provided as a second input signal (block 414). A first carrier signal (e.g., an I carrier signal) having a phase determined based on the sign of the first modulating signal may be obtained (block 416). A second carrier signal (e.g., a Q carrier signal) having a phase determined based on the sign of the second modulating signal may be obtained (block 418).

The first carrier signal may be amplitude modulated with the first input signal to obtain a first amplitude modulated signal (block 420). The second carrier signal may be amplitude modulated with the second input signal to obtain a second amplitude modulated signal (block 422). The first and second amplitude modulated signals may be summed to obtain a quadrature modulated signal that is both amplitude and phase modulated (block 424).

For block 416, either first or second LO signal may be provided as the first carrier signal based on the sign of the first modulating signal. For block 418, either third or fourth LO signal may be provided as the second carrier signal based on the sign of the second modulating signal. The first and second LO signals may be 180 degrees out of phase, the third and fourth LO signals may be 180 degrees out of phase, and the first and third LO signals may be 90 degrees out of phase, as shown in FIG. 2. The first and second carrier signals may also be generated in other manners.

For block 420, the amplitude modulation of the first carrier signal may be achieved by switching on and off a first class-E amplifier with the first carrier signal and controlling the output amplitude of the first class-E amplifier with the first input signal. For block 422, the amplitude modulation of the second carrier signal may be achieved by switching on and off a second class-E amplifier with the second carrier signal and controlling the output amplitude of the second class-E amplifier with the second input signal. The amplitude modulation may also be achieved in other manners.

The bi-polar modulator described herein may provide certain advantages. The amplitude modulators used for the bi-polar modulator may be implemented with efficient switching amplifiers, e.g., as shown in FIG. 3. The bi-polar modulator may be less complex than a polar modulator, which requires Cartesian-to-polar conversion and wideband phase modulation.

The bi-polar modulator described herein may be used for various single-carrier and multi-carrier modulation schemes including (but not limited to) bi-phase shift keying (BPSK), quadrature phase shift keying (QPSK), M-ary phase shift keying (M-PSK), quadrature amplitude modulation (QAM), orthogonal frequency division multiplexing (OFDM), single-carrier frequency division multiplexing (SC-FDM), Gaussian minimum shift keying (GMSK), etc. These various modulation schemes are known in the art.

The bi-polar modulator described herein may be used for various systems and applications. For example, the bi-polar modulator may be used for wireless communication systems, wireline communication systems, wireless local area networks (WLANs), etc. The wireless communication systems may be Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, etc. A CDMA system may implement a radio technology such as Universal Terrestrial Radio Access (UTRA), cdma2000, etc. UTRA includes Wideband CDMA (WCDMA) and other variants of CDMA. cdma2000 covers IS-2000, IS-95, and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM®, etc. These various radio technologies and standards are known in the art.

The bi-polar modulator described herein may be implemented on an IC, an analog IC, an RFIC, a mixed-signal IC, an ASIC, a printed circuit board (PCB), an electronics device, etc. The bi-polar modulator may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), hetero-junction bipolar transistor (HBT), etc. The bi-polar modulator may also be implemented with micro-electro-mechanical (MEMS) switches for switching transistors.

An apparatus implementing the bi-polar modulator described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising a bi-polar modulator, wherein the bi-polar modulator comprises:
a first amplitude modulator operative to amplitude modulate a first carrier signal with a first input signal that comprises an absolute value of a first modulating signal and provide a first amplitude modulated signal;
a second amplitude modulator operative to amplitude modulate a second carrier signal with a second input signal that comprises an absolute value of a second modulating signal and provide a second amplitude modulated signal; and
a summer operative to sum the first and second amplitude modulated signals and provide a quadrature modulated signal.

2. The apparatus of claim 1, further comprising:
a first unit operative to receive the first modulating signal and provide the absolute value of the first modulating signal; and
a second unit operative to receive the second modulating signal and provide the absolute value of the second modulating signal.

3. The apparatus of claim 1, wherein the first carrier signal has a phase determined based on a sign of the first modulating signal, and wherein the second carrier signal has a phase determined based on a sign of the second modulating signal.

4. The apparatus of claim 1, further comprising:
a first switch operative to receive first and second local oscillator (LO) signals and provide either the first or second LO signal as the first carrier signal based on a sign of the first modulating signal; and
a second switch operative to receive third and fourth LO signals and provide either the third or fourth LO signal as the second carrier signal based on a sign of the second modulating signal.

5. The apparatus of claim 4, further comprising:
a first unit operative to receive the first modulating signal and generate a first control signal based on the sign of the first modulating signal; and
a second unit operative to receive the second modulating signal and generate a second control signal based on the sign of the second modulating signal,
wherein the first switch is operative to provide either the first or second LO signal based on the first control signal, and wherein the second switch is operative to provide either the third or fourth LO signal based on the second control signal.

6. The apparatus of claim 4, further comprising:
a phase splitter operative to receive an input LO signal and provide the first, second, third and fourth LO signals.

7. The apparatus of claim 4, wherein the first and second LO signals are 180 degrees out of phase, the third and fourth LO signals are 180 degrees out of phase, and the first and third LO signals are 90 degrees out of phase.

8. The apparatus of claim 1, wherein each of the first and second amplitude modulators comprises a class-E amplifier.

9. The apparatus of claim 1, wherein the first amplitude modulator comprises a first class-E amplifier being switched on and off by the first carrier signal and having an output amplitude determined by the first input signal, and wherein the second amplitude modulator comprises a second class-E amplifier being switched on and off by the second carrier signal and having an output amplitude determined by the second input signal.

10. The apparatus of claim 1, wherein the quadrature modulated signal comprises a CDMA signal.

11. An integrated circuit comprising a bi-polar modulator, wherein the bi-polar modulator comprises:
a first amplitude modulator operative to amplitude modulate a first carrier signal with a first input signal and provide a first amplitude modulated signal, wherein the first input signal comprises an absolute value of a first modulating signal;
a second amplitude modulator operative to amplitude modulate a second carrier signal with a second input signal and provide a second amplitude modulated signal, wherein the second input signal comprises an absolute value of a second modulating signal; and
a summer operative to sum the first and second amplitude modulated signals and provide a quadrature modulated signal.

12. The integrated circuit of claim 11, wherein the first carrier signal has a phase determined based on a sign of the first modulating signal, and the second carrier signal has a phase determined based on a sign of the second modulating signal.

13. The integrated circuit of claim 11, further comprising:
a first switch operative to receive first and second local oscillator (LO) signals and provide either the first or second LO signal as the first carrier signal based on a sign of the first modulating signal; and
a second switch operative to receive third and fourth LO signals and provide either the third or fourth LO signal as the second carrier signal based on a sign of the second modulating signal.

14. The integrated circuit of claim 13, wherein the first and second LO signals are 180 degrees out of phase, the third and fourth LO signals are 180 degrees out of phase, and the first and third LO signals are 90 degrees out of phase.

15. The integrated circuit of claim 11, wherein the first amplitude modulator comprises a first class-E amplifier being switched on and off by the first carrier signal and having an output amplitude determined by the first input signal, and wherein the second amplitude modulator comprises a second class-E amplifier being switched on and off by the second carrier signal and having an output amplitude determined by the second input signal.

16. An apparatus for communication, comprising:
a bi-polar modulator operative to amplitude modulate a first carrier signal with a first input signal to obtain a first amplitude modulated signal, wherein the first input signal comprises an absolute value of a first modulating signal, the bi-polar modulator operative to amplitude modulate a second carrier signal with a second input signal to obtain a second amplitude modulated signal, wherein the second input signal comprises an absolute value of a second modulating signal, and the bi-polar modulator is further operative to combine the first and second amplitude modulated signals to obtain a quadrature modulated signal.

17. The apparatus of claim 16, wherein the first carrier signal has a phase determined based on a sign of the first modulating signal, and the second carrier signal has a phase determined based on a sign of the second modulating signal.

18. The apparatus of claim 16, further comprising:
a phase splitter operative to receive an input local oscillator (LO) signal and provide first, second, third, and fourth LO signals, wherein either the first or second LO signal is provided as the first carrier signal based on a sign of the first modulating signal, and wherein either the third or fourth LO signal is provided as the second carrier signal based on a sign of the second modulating signal.

19. A method of performing modulation, comprising:
amplitude modulating a first carrier signal by a bi-polar modulator with a first input signal to obtain a first amplitude modulated signal, wherein the first input signal comprises an absolute value of a first modulating signal;
amplitude modulating a second carrier signal by the bi-polar modulator with a second input signal to obtain a second amplitude modulated signal, wherein the second input signal comprises an absolute value of a second modulating signal; and
summing the first and second amplitude modulated signals by the bi-polar modulator to obtain a quadrature modulated signal.

20. The method of claim 19, wherein the first carrier signal has a phase determined based on a sign of the first modulating signal, and the second carrier signal has a phase determined based on a sign of the second modulating signal.

21. The method of claim 19, further comprising:
providing either a first or a second local oscillator (LO) signal as the first carrier signal based on a sign of the first modulating signal; and
providing either a third or a fourth LO signal as the second carrier signal based on a sign of the second modulating signal.

22. The method of claim 21, wherein the first and second LO signals are 180 degrees out of phase, the third and fourth LO signals are 180 degrees out of phase, and the first and third LO signals are 90 degrees out of phase.

23. The method of claim 19, wherein the amplitude modulating the first carrier signal comprises switching on and off a first amplifier with the first carrier signal and controlling output amplitude of the first amplifier with the first input signal, and wherein the amplitude modulating the second carrier signal comprises switching on and off a second amplifier with the second carrier signal and controlling output amplitude of the second amplifier with the second input signal.

24. An apparatus for performing modulation, the apparatus comprising a bi-polar modulator, wherein the bi-polar modulator comprises:
means for amplitude modulating a first carrier signal with a first input signal to obtain a first amplitude modulated signal, wherein the first input signal comprises an absolute value of a first modulating signal;
means for amplitude modulating a second carrier signal with a second input signal to obtain a second amplitude modulated signal, wherein the second input signal comprises an absolute value of a second modulating signal; and
means for summing the first and second amplitude modulated signals to obtain a quadrature modulated signal.

25. The apparatus of claim 24, wherein the first carrier signal has a phase determined based on a sign of the first modulating signal, and the second carrier signal has a phase determined based on a sign of the second modulating signal.

26. The apparatus of claim 24, further comprising:

means for providing either a first or a second local oscillator (LO) signal as the first carrier signal based on a sign of the first modulating signal; and means for providing either a third or a fourth LO signal as the second carrier signal based on a sign of the second modulating signal.

27. The apparatus of claim 26, wherein the first and second LO signals are 180 degrees out of phase, the third and fourth LO signals are 180 degrees out of phase, and the first and third LO signals are 90 degrees out of phase.

28. The apparatus of claim 24, wherein the means for amplitude modulating the first carrier signal comprises means for performing switching with the first carrier signal and means for controlling output amplitude with the first input signal to generate the first amplitude modulated signal, and wherein the means for amplitude modulating the second carrier signal comprises means for performing switching with the second carrier signal and means for controlling output amplitude with the second input signal to generate the second amplitude modulated signal.

* * * * *